US011258383B2

(12) United States Patent
Watkins (10) Patent No.: US 11,258,383 B2
(45) Date of Patent: Feb. 22, 2022

(54) ACTIVE GATE DRIVER WITH FEEDBACK (71) Applicant: Kabushiki Kaisha Toshiba, Minato-ku (JP)

(72) Inventor: Gavin Tomas Watkins, Bristol (GB)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 16/820,762

(22) Filed: Mar. 17, 2020

(65) Prior Publication Data

US 2021/0297022 A1    Sep. 23, 2021

(51) Int. Cl.
  *H02P 7/29*  (2016.01)
  *H03H 21/00*  (2006.01)
(52) U.S. Cl.
  CPC ........... *H02P 7/29* (2013.01); *H03H 21/0043* (2013.01)
(58) Field of Classification Search
  CPC .................................................. H03H 21/0043
  USPC ..................................................... 318/400.17
  See application file for complete search history.

(56) References Cited

U.S. PATENT DOCUMENTS

| | | | | |
|---|---|---|---|---|
| 2010/0182091 A1* | 7/2010 | Huang | .................. | H03D 7/1433 330/278 |
| 2015/0072631 A1* | 3/2015 | Tanio | .................... | H03F 1/3241 455/114.3 |
| 2015/0318850 A1* | 11/2015 | Hiyama | ............... | H03K 17/163 318/400.26 |

FOREIGN PATENT DOCUMENTS

GB    2 257 854 A    1/1993

OTHER PUBLICATIONS

Harry C. P. Dymond, et al., "A 6.7-GHz Active Gate Driver for GaN FETs to Combat Overshoot, Ringing, and EMI", IEEE Transactions on Power Electronics, vol. 33, No. 1, Jan. 2018, pp. 581-594.
A. Shorten, et al., "A Segmented Gate Driver IC for the Reduction of IGBT Collector Current Over-Shoot at Turn-On", Proceedings of the 25th International Symposium on Power Semiconductor Devices & ICs (ISPSD), 2013, pp. 73-76.
Hu Liangdeng, et al., "A New Two Feed-Back Control Method Integrated in Digital Gate Driver for Large Power IGBT," 2016 IEEE Information Technology, Networking, Electronic and Automation Control Conference, 2016, pp. 1153-1156.
Michael Ebli, et al., "A Novel Gate Driver Approach Using Inductive Feedback to Increase the Switching Speed of Power Semiconductor Devices", 2017 19th European Conference on Power Electronics and Applications (EPE'17 ECCE Europe), 2017, pp. P.1-P.7.

* cited by examiner

Primary Examiner — Jorge L Carrasquillo
(74) Attorney, Agent, or Firm — Oblon, McClelland, Maier & Neustadt, L.L.P.

(57) ABSTRACT

An electric motor control system comprising an electronic switch configured to control a current flow in a motor winding based on a pre-distorted signal and a digital pre-distorter configured to generate the pre-distorted signal based on an input signal and a plurality of coefficients, wherein the plurality of coefficients are based on a feedback signal that represents the current flow in the motor winding.

18 Claims, 7 Drawing Sheets

ACTIVE GATE DRIVER WITH FEEDBACK

FIELD

Embodiments described herein relate generally to an electric motor control system and a method of controlling an electric motor.

BACKGROUND

Brushless DC (BLDC) motors have been widely adopted for many applications including electric vehicles, industrial cooling and consumer electronics. Brushless DC motors typically comprise a number of magnets on the rotor and a number of electromagnetic coils on the stator. In order to move the rotor the coils are synchronously energised with pulsed waveforms.

For maximum efficiency, the coils should be driven with a sharp pulsed waveform so that the coils are either fully energised or switched off. However practical coils represent a complex load comprising resistive and inductive elements which combined with stray parasitic components in the printed circuit board (PCB) layout produce resonant circuits. As a result, when a coil is driven by a sharp pulsed waveform the harmonics of the pulse excite these resonant circuits, resulting in ringing on the current and voltage waveforms. This ringing produces electronic magnetic interference and can prevent a motor from complying with Electromagnetic Compatibility (EMC) regulations.

One way to reduce the effect of this ringing is to increase the amount of metal shielding surrounding the motor; however this is expensive and increases the weight of the motor assembly. In light of this a new approach to controlling a Brushless DC (BLDC) motor is required that is efficient and meets Electromagnetic Compatibility (EMC) regulations.

Arrangements of the present invention will be understood and appreciated more fully from the following detailed description, made by way of example only and taken in conjunction with drawings in which.

DETAILED DESCRIPTION

According to a first aspect there is provided an electric motor control system comprising an electronic switch configured to control a current flow in a motor winding based on a pre-distorted signal. The electric motor control system further comprising a digital pre-distorter configured to generate the pre-distorted signal based on an input signal and a plurality of coefficients wherein the plurality of coefficients are based on a feedback signal that represents the current flow in the motor winding.

In an embodiment the input signal is a digital signal.

In an embodiment the digital pre-distorter is implemented as one of: a memory polynomial, memory based Volterra, dynamic deviation reduction, deep neural network, nested look-up-table stored in memory, envelope memory polynomial, Wiener, Hammerstein and twin nonlinear two-box In an embodiment the digital pre-distorter is implemented using a Finite Impulse Response (FIR) filter and the plurality of coefficients are a plurality of Finite Impulse Response (FIR) filter coefficients.

In an embodiment the digital pre-distorter is implemented using a waveform shaper and the plurality of coefficients are a plurality waveform shaping coefficients. In an embodiment the waveform shaper is a Finite Impulse Response (FIR) filter and the plurality of waveform shaping coefficients are a plurality of Finite Impulse Response (FIR) filter coefficients. In this embodiment the plurality of waveform shaping coefficients represent a plurality of weights that are applied to (e.g. by multiplication with) samples of an input signal. Optionally, the plurality of waveform shaping coefficients are applied to an input waveform using a FIR filter structure in the same manner as a plurality of FIR filter coefficients are applied to an input waveform.

In an embodiment the electric motor control system further comprises a delay element configured to delay the input signal; a comparator configured to generate an error signal based on the difference between a delayed input signal and the feedback signal; and an adaptive algorithm configured to generate the plurality of waveform shaping coefficients based on the error signal.

Optionally, the plurality of filter coefficients improve switching characteristics. Optionally, the plurality of filter coefficients iteratively reduce the amplitude of the error signal, or in other words ensure the feedback signal is a close replica of the input signal.

In an embodiment the adaptive algorithm is any optimisation algorithm. Optionally, the adaptive algorithm is one of: a generic algorithm (GA) or mean square error optimisation (MSE).

In an embodiment the electric motor control system further comprises an attenuator configured to change the amplitude of the feedback signal.

In an embodiment the electric motor control system further comprising an attenuator configured to fix the amplitude of the feedback signal. Optionally, the attenuator is configured to reduce the amplitude of the feedback signal to match the amplitude of the input signal. Optionally, the attenuator is configured to set the amplitude of the feedback signal.

In an embodiment, fixing the amplitude of the feedback signal comprises changing the amplitude of the feedback signal to a predetermined amplitude.

In an embodiment the delay element is configured to delay the input signal such that samples of the input signal align with samples of the feedback signal. Optionally, samples align when a sample of the delayed input signal is compared with a sample of the feedback signal that represents the current flow caused by the sample of the input signal. Preferably, samples align when the input signal is delayed by an amount corresponding to the latency of the digital pre-distorter, active gate driver, electronic switch and attenuator.

In an embodiment the motor winding is in a Brushless DC motor.

In an embodiment the electronic switch is a Metal Oxide Semiconductor Field Effect Transistor or an Insulated-gate Bipolar transistor.

In an embodiment the electric motor control system further comprises an active gate driver connected to an input of the electric switch, wherein the active gate driver is configured to amplify the pre-distorted signal.

In an embodiment the electric motor control system further comprises a current sensor configured to measure the current flow in the motor winding and generate the feedback signal. Optionally, the current sensor is a hall-effect sensor.

In an embodiment the electric motor control system further comprises a voltage sensor or other sensor configured to generate the feedback signal.

In an embodiment the feedback signal comprises a current signal and a voltage signal. The current signal is measured by the current sensor; and the electric motor control system further comprises a voltage sensor configured to measure a voltage at the motor winding and generate the voltage signal. In an embodiment the voltage at the motor winding in the voltage, $V_{OUT}$, shown in FIG. 4, or in other words the voltage signal is the voltage across the electronic switch.

The combination of a voltage sensor to measure the voltage across the motor winding and a current sensor to measure the current flow in the motor winding can have various advantages. For example, by observing both current waveforms and voltage waveforms it is possible to generate a feedback signal that better reflects the operation of the motor. In an embodiment, the feedback signal weights the current signal and the voltage signal according to predetermined weights. In another embodiment, the adaption algorithm uses different parts of the feedback signal depending on the switching states of the motor winding. For example, the system may place more emphasis on the current waveform during a turn on event (i.e. when the motor winding is energised) and place more emphasis on the voltage waveform during a turn off event. In an embodiment, placing more emphasis means preferentially weighting, or looking exclusively at, the relevant signal.

In an embodiment an electric motor comprising a plurality of electric motor windings and a plurality of electric motor control systems is disclosed wherein each motor winding in the plurality of motor windings is controlled by an electric motor control system of the plurality of motor control systems.

According to a second aspect of the invention there is provided a method of controlling an electric motor comprising controlling, by an electronic switch, a current flow in a motor winding based on a pre-distorted signal. The method further comprising generating, by a digital pre-distorter, the pre-distorted signal based on an input signal and a plurality of coefficients wherein the plurality of coefficients are based on a feedback signal that represents the current flow in the motor winding.

In an embodiment the digital pre-distorter is implemented using a Finite Impulse Response (FIR) filter and the plurality of coefficients are a plurality of Finite Impulse Response (FIR) filter coefficients.

In an embodiment the digital pre-distorter is implemented using a waveform shaper and the plurality of coefficients are a plurality of waveform shaping coefficients.

In an embodiment the method further comprises delaying, by a delay element, the input signal; generating, by a comparator, an error signal based on the difference between a delayed input signal and the feedback signal; and generating, by an adaptive algorithm, the plurality of waveform shaping coefficients based on the error signal.

In an embodiment the method further comprises fixing, by an attenuator, the amplitude of the feedback signal.

In an embodiment the method further comprises delaying the input signal such that samples of the input signal align with samples of the feedback signal.

In an embodiment the motor winding is in a Brushless DC motor.

In an embodiment the electronic switch is a Metal Oxide Semiconductor Field Effect Transistor or an Insulated-gate Bipolar transistor.

In an embodiment the method further comprises amplifying, by an active gate driver, the pre-distorted signal.

In an embodiment the method further comprises comprising measuring, by a current sensor, the current flow in the motor winding and generating, by the current sensor, the feedback signal.

In an embodiment the feedback signal comprises a current signal and a voltage signal and wherein the current signal is measured by the current sensor and the method further comprises measuring, by a voltage sensor a voltage at the motor winding and generating, by the voltage sensor, the voltage signal. In an embodiment the voltage at the motor winding in the voltage, $V_{OUT}$, shown in FIG. 4, or in other words the voltage signal is the voltage across the electronic switch.

Figure 1A:
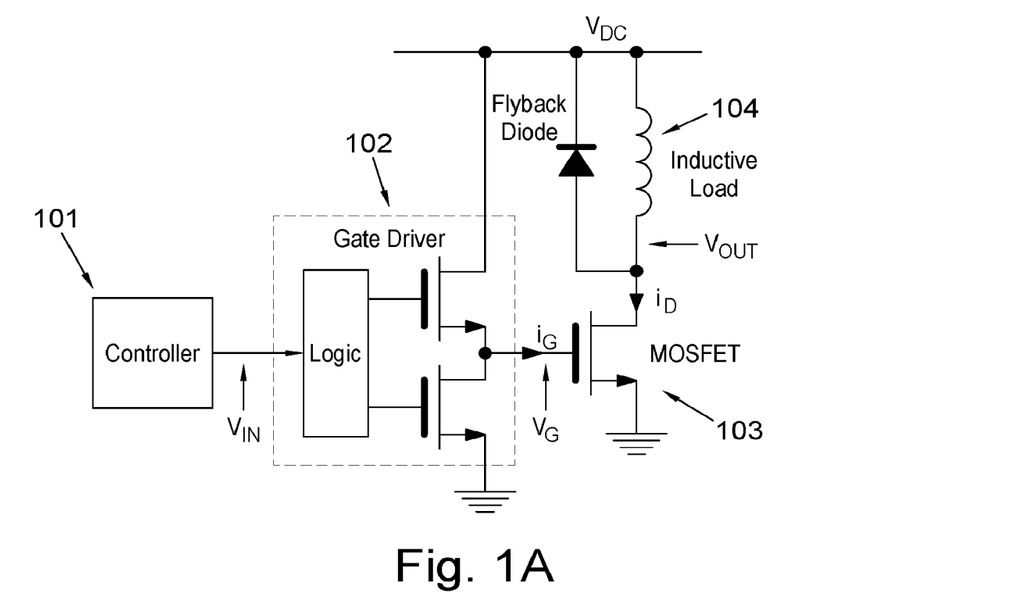
FIG. 1A shows a prior art gate driver circuit.

FIG. 1A shows a prior art gate driver circuit. FIG. 1A shows a gate driver circuit comprising a controller 101, a gate driver 102, an electronic switch 103 and an inductive load 104. In FIG. 1A the electronic switch 103 is a Metal Oxide Semiconductor Field Effect Transistor (MOSFET) and the inductive load 104 represents a motor winding of a Brushless DC motor. In FIG. 1 the input voltage to the electronic switch, $v_G$, can vary between ground and the supply voltage, $V_{DC}$. When the gate voltage, $v_G$, reaches a certain threshold the electronic switch 103 turns on causing a large drain current, $i_D$, to flow and the output voltage, $v_{OUT}$, to drop. Likewise, when the gate voltage, $v_G$, drops below the threshold the electronic switch 103 will turn off.

Figure 1B:
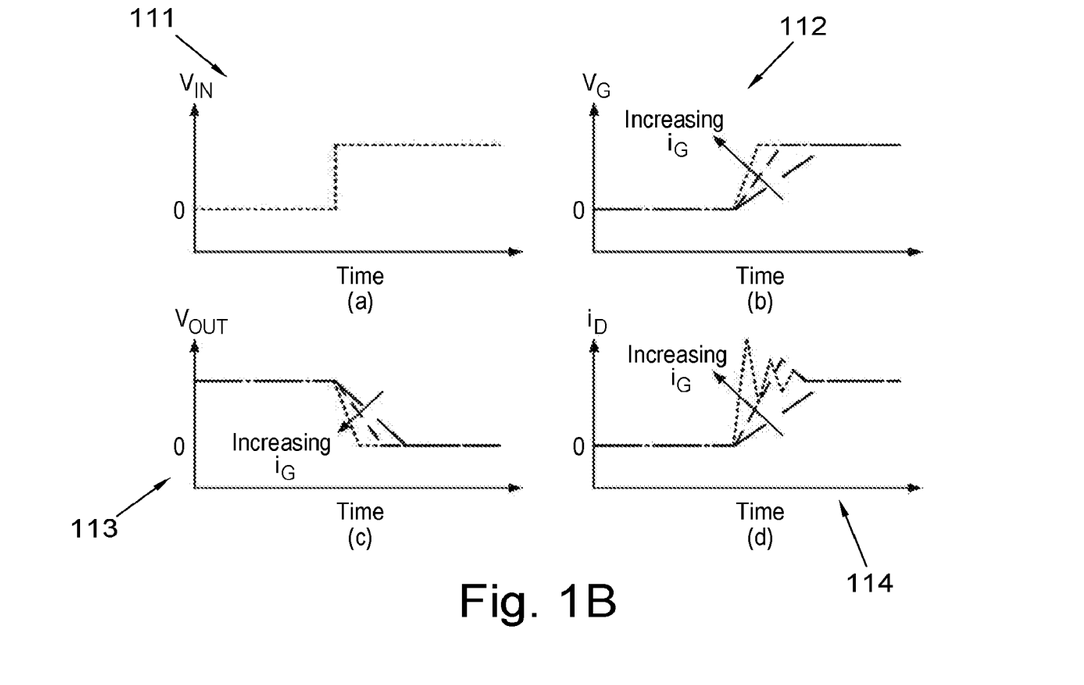
FIG. 1B shows current and voltage waveforms for the prior art gate driver of FIG. 1A.

FIG. 1B shows current and voltage waveforms for the prior art gate driver of FIG. 1A. A first plot 111 of FIG. 1B shows the voltage at the input to the gate driver 102, $v_{IN}$, changing over time as a step-function input signal is outputted by the controller 101. This signal is then transformed by the gate driver 102 into a signal suitable for driving the gate of the MOSFET. The electronic switch 103 will typically be a physically large device and will possess a large capacitance between its gate and its source, $C_{GS}$. Due to the large gate-source capacitance, $C_{GS}$, of the electronic switch 103 it will take a finite amount of time for the gate voltage of the electronic switch 103, $v_G$, to respond to the input signal. The amount of time depends on the available gate current, $i_G$, which is often limited by the gate driver 102. This effect can be seen from a second plot 112 that shows the rise time of the gate voltage, $v_G$, decreasing as the available gate current, $i_G$, increases. Accordingly, this has the effect of reducing the fall time of the output voltage, $v_{OUT}$, as can be seen in a third plot 113.

Delays in the rise and fall times of the output voltage represent a loss of efficiency. Ideally, $v_{OUT}$ should replicate a step function (i.e. rise and fall quickly) for maximum efficiency.

In FIG. 1A the electronic switch 103 controls an inductive load 104. Optionally, the inductive load is a motor winding of a Brushless DC (BLDC) machine. Due to the inductive nature of the load 104 and stray parasitic components of the PCB the drain current, $i_D$, will experience ringing when the electronic switch 103 switches between states. This effect can be seen in a fourth plot 114. The greater the gate current, $i_G$, the quicker the output voltage, $v_{OUT}$, changes and the larger the amplitude of ringing on the drain current, $i_G$. A varying current flow like this can increase the amount of radiation from the switching circuit. Consequently, the electronic motor control circuit of FIG. 1A contains a trade-off between achieving high efficiency (e.g. by using a sharp-pulse switching waveform) and remaining compliant with Electromagnetic Compatibility (EMC) regulations by limiting the amount of ringing on the drain current.

Previous approaches to solving this problem have been divided into three groups: analogue open loop systems, analogue closed loop systems and digital open loop systems.

Figure 2A:
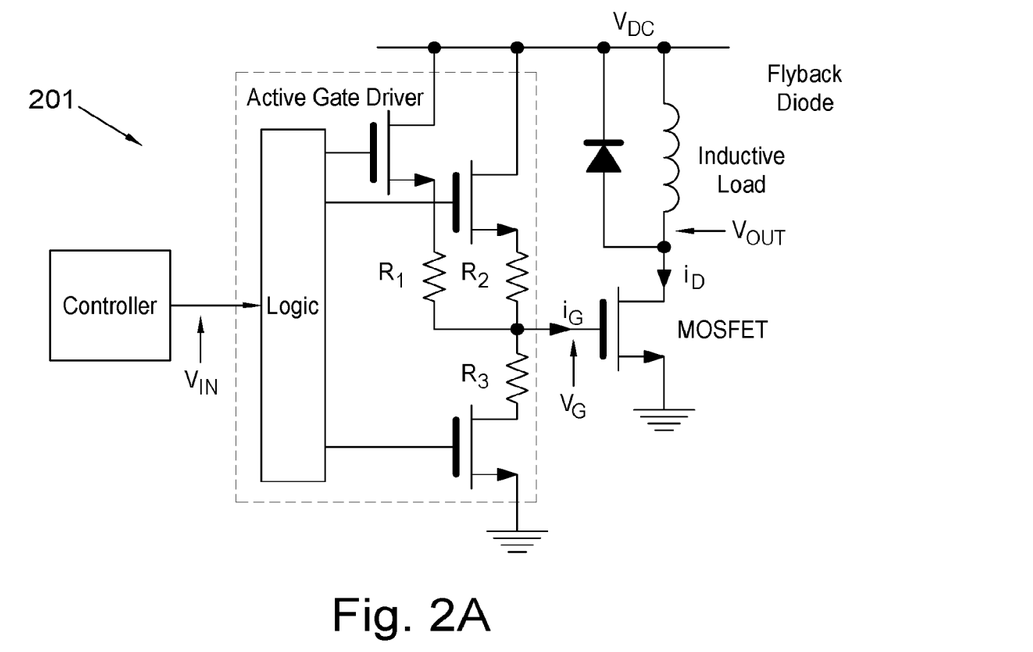
FIG. 2A shows a prior art open loop active gate driver with a switched variable output resistance.

FIG. 2A shows a prior art open loop active gate driver with a switched variable output resistance. FIG. 2A shows an active gate driver circuit 201 comprising a number of switches connected to the same power supply but with different output resistances. By varying the activated switches in the gate driver circuit 201 it is possible to shape the voltage at the gate of the electronic switch, $v_G$, such that a sharp pulse waveform is avoided.

Figure 2B:
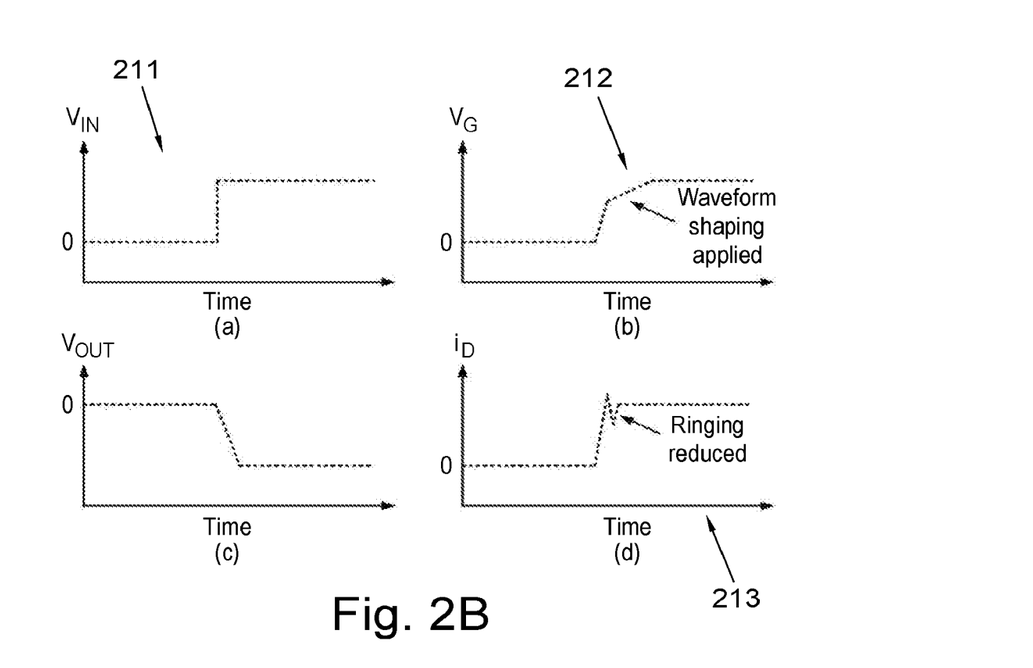
FIG. 2B shows current and voltage waveforms for the prior art gate driver of FIG. 2A.

FIG. 2B shows current and voltage waveforms for the prior art gate driver of FIG. 2A. A first plot 211 of FIG. 2B shows the voltage at the input to the gate driver, $v_{IN}$, changing over time as a step-function input signal is outputted by the controller. A second plot 212 shows a voltage waveform at the gate of the electronic switch, $v_G$, which has been shaped by the gate driver circuit 201. As can be seen from a third plot 213, by shaping the voltage signal applied to the gate of the electronic switch it is possible to reduce the amount of ringing on the drain current, $i_D$.

Pulse shaping using variable output resistance gate driver circuits as shown in FIG. 2A can achieve a reduction in ringing on the drain current, $i_D$, however this is at the expense of complexity. Furthermore, these circuits are hard to optimise and their performance can change in response to variations in: temperature, humidity, supply voltage or mechanical loading of the Brushless DC (BLDC) motor.

Figure 3:
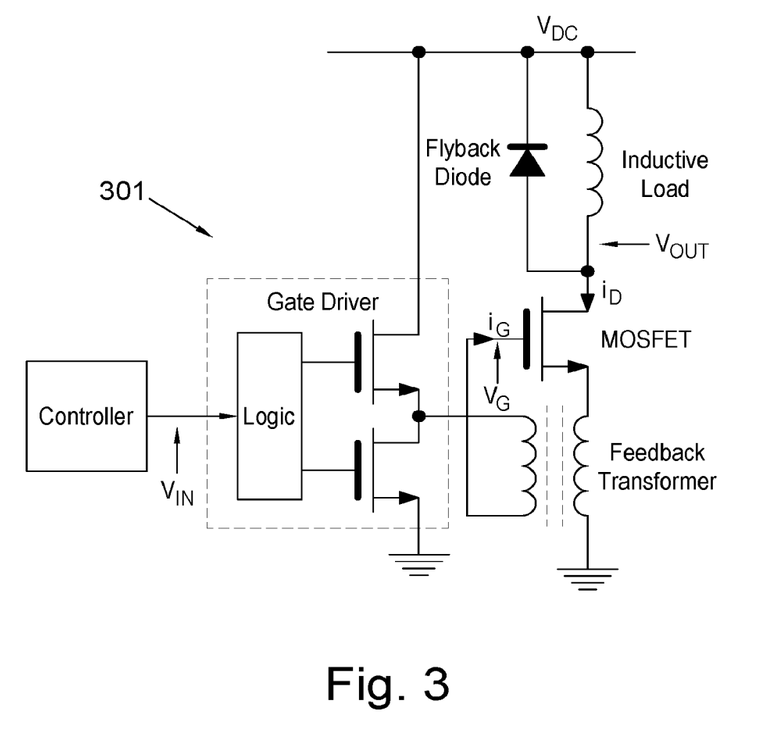
FIG. 3 shows a prior art analogue closed loop active gate driver with transformer feedback.

FIG. 3 shows a prior art analogue closed loop active gate driver with transformer feedback. FIG. 3 shows an active gate driver circuit 301 comprising a feedback transformer. In FIG. 3 the feedback transformer acts as a form of feedback between the source current of the MOSFET and the gate voltage. Using transformer feedback in this way enables the active gate driver circuit 301 to maintain a degree of EMC compliance and efficiency under changing conditions (e.g. temperature, humidity, supply voltage or mechanical loading of the Brushless DC (BLDC) motor). However, this technique can be imprecise and cannot generally produce the optimum control voltage to minimise the ringing on the drain current, $i_D$.

Furthermore, there are also other issues with this approach. One fundamental issue is the delay of the electronic switch due to the large gate-source capacitance of the MOSFET, $C_{GS}$. In the diver circuit of FIG. 3, this is likely to be a significant portion of the switching cycle, which is typically 10-100 kHz in modern systems. As a result, approaches that attempt to correct the current waveform in real time (such as that shown in FIG. 3) are often of limited effectiveness and are not generally applicable for real-world switching applications.

Figure 4:
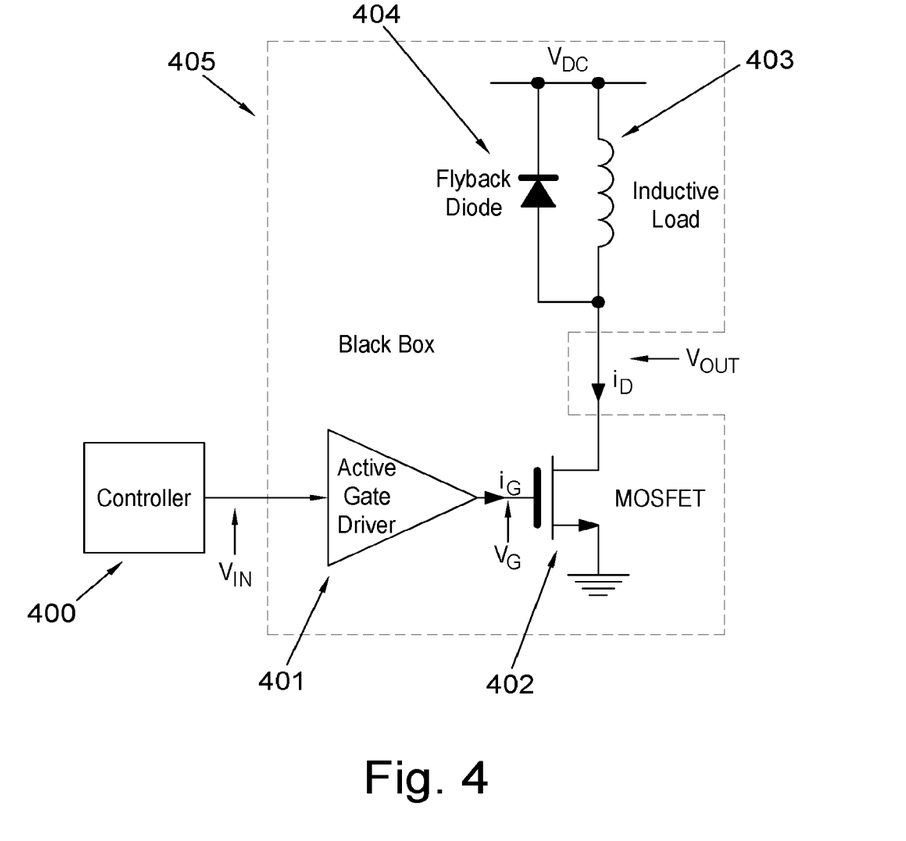
FIG. 4 shows a black box characterisation of an active gate driver, a MOSFET and an inductive load according to an embodiment.

FIG. 4 shows a black box characterisation of an active gate driver, a MOSFET and an inductive load according to an embodiment. FIG. 4 shows a controller 400 that generates a control signal, $v_{in}$. In FIG. 4 the output of the controller 400 is connected to an active gate driver 401. The active gate driver 401 is a power amplifier that accepts a low-power input from the controller 400 and produces a high-current drive output for the gate of a high-power transistor such as an Insulated-gate Bipolar transistors (IGBT) or a Metal Oxide Semiconductor Field Effect Transistor (MOSFET). In FIG. 4 the active gate driver 401 serves as an interface between the controller 400 and an electronic switch 402. The active gate driver 401 could take many forms including that shown in FIG. 1 or a simple on off switch. More complex gate drivers can offer several different output states (such as that shown in FIG. 2).

In FIG. 4 the electronic switch 402 is a Metal Oxide Semiconductor Field Effect Transistor (MOSFET), however other types of switches could also be used (e.g. an Insulated-gate Bipolar transistors (IGBT)).

The electronic switch 402 controls the operation of an inductive load 403. Optionally, a freewheeling diode 404 is connected in parallel across the inductive load 403 to provide a path for the current flowing through the inductive load when the electronic switch 402 switches off.

FIG. 4 shows a black box characterisation 405 of the active gate driver and the MOSFET. The black box characterisation uses the output voltage of the controller 400, $v_{IN}$, as an input and the drain current of the electronic switch 402, $i_D$, as the output of the black box characterisation. In an embodiment the output of the black box characterisation 405 further comprises the output voltage, $v_{OUT}$. By treating the active gate driver as a black box characterisation it is possible to create control circuits that are not restricted to use with a particular combination of motor winding and electronic switch.

Figure 5:
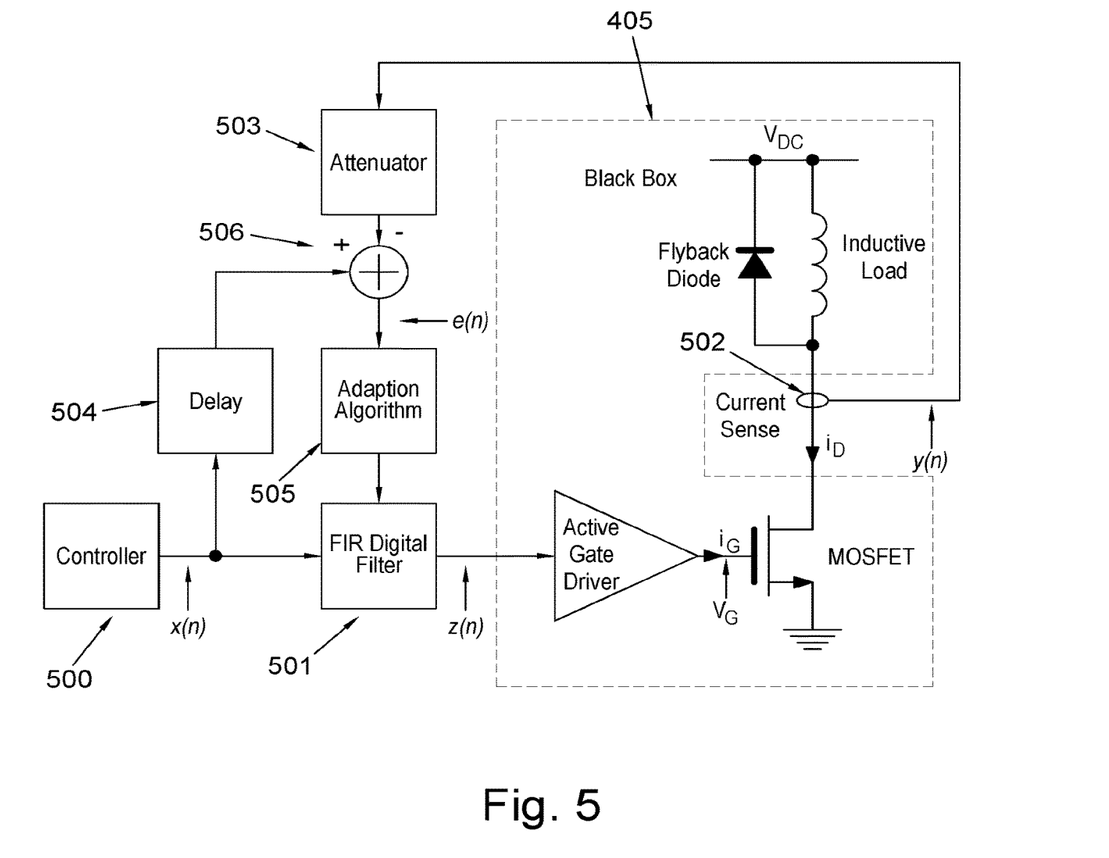
FIG. 5 shows an electronic switching circuit with feedback according to an embodiment.

FIG. 5 shows an electronic switching circuit according to an embodiment. FIG. 5 shows an electronic circuit with the black box characterisation 405 discussed in relation to FIG. 4. In FIG. 5 the output of a controller 500 is represented as a series of n samples, x(n). The output of the controller 500 is also connected to a delay element 504 and a digital pre-distorter 501. In FIG. 5 the digital pre-distorter 501 is a Finite Impulse Response (FIR) filter, which will be discussed in more detail below.

The digital pre-distorter 501 applies pre-distortion to the input signal, x(n), in order to generate a pre-distorted signal, z(n), that is shaped to reduce the amount of ringing present on the drain current, $i_D$, of the electronic switch. z(n) could be an analogue signal if the Active Gate Driver is an analogue amplifier, or digital signal of the required resolution if the Active Gate Driver is of the digital type.

The output of the black box characterisation 405 is the drain current, $i_D$, of the electronic switch. As discussed above in relation to FIG. 2B, the amount of ringing that can be observed on the drain current, $i_D$, depends on the shape of the waveform driving the gate of the electronic switch (i.e. the predistorted signal, z(n)).

In the embodiment of FIG. 5 the drain current, $i_D$, is observed using a current sensor 502, thereby creating a feedback signal, y(n), that replicates the drain current, $i_D$, of the electronic switch. In FIG. 5 the feedback signal is indicated by the arrow that is an input to the attenuator 503. In an embodiment, the current sensor 502 is a hall-effect sensor. In another embodiment the current sensor is any sensor capable of measuring the current in the inductive load. The feedback signal, y(n), is connected to the input of an attenuator 503. The attenuator 503 reduces the amplitude of the feedback signal, y(n), such that any subsequent comparisons are conducted on signals of the same amplitude. A comparator 506 is connected to the output of the attenuator 503 and the output of the delay element 504.

In an embodiment, the delay element 504 is a chain of clocked delays ($Z^{-1}$). The delay element 504 is configured such that the comparator 506 compares a sample of the feedback signal, y(n), with the sample of the input signal, x(n), that caused it. Optionally, the delay of the delay element 504 may be varied in order to align samples of the feedback signal, y(n), with the input signal, x(n). This delay compensates for the time taken for a signal to propagate through the digital pre-distorter 501, the active gate driver, the MOSFET and the attenuator 503.

The comparator 506 determines the difference between the delayed version of the input signal, and an attenuated version of the feedback signal. This difference is represented by an error signal, e(n).

The output of the comparator 506 (i.e. the error signal, e(n)) is an input to an adaptive algorithm block 505. The adaption algorithm block 505 generates filter tap coefficients, otherwise known as gain weightings, which improve switching characteristics. In an embodiment the adaption algorithm generates FIR Filter coefficients to optimise the error signal, e(n), with respect to a particular criteria for example efficiency or Electromagnetic compatibility (EMC). In effect ensuring that the output signal (i.e. the feedback signal, y(n)) is a close replica of the input signal, x(n). In an embodiment the adaption algorithm is based on any optimisation method including, but not limited to, a generic algorithm (GA) or a mean square error (MSE) optimisation.

For example, in Mean Square Error (MSE) optimisation the adaptive algorithm optimises the filter taps/coefficients to minimise the average of the squares of the error signal, e(n). Various implementations of Mean Square Error (MSE) optimisation algorithms are known in the art. In one implementation, the algorithm iteratively converges on a set of preferred filter coefficients based on a gradient descent algorithm. In this implementation, the algorithm approaches the optimum filter weights by ascending and descending a mean-square-error vs. filter weights curve. The rate of converge depends on a convergence coefficient, otherwise known as a step size. In an embodiment, the step size is set by a user. In another embodiment, the step size is predetermined.

FIG. 5 also shows a digital pre-distorter 501 that is connected to the output of the controller 500 and the output of the adaption algorithm block 505. In FIG. 5 the digital pre-distorter 501 is implemented using a Finite Impulse Response (FIR) filter. The digital pre-distorter 501 receives filter taps coefficients, otherwise known as gain weightings, from the adaption algorithm block 505 and applies these coefficients to the input signal, x(n). In this way the input signal, x(n), is shaped such that the ringing present on the drain current, $i_D$, is minimised.

By providing the feedback signal, y(n), the system shown in FIG. 5 can iteratively adapt the filter coefficients applied to the input signal, x(n), in response to changes in conditions (e.g. temperature, humidity, supply voltage or mechanical loading of the Brushless DC (BLDC) motor). The system of FIG. 5 represents a digital closed loop technique for controlling the drain current in an inductive load.

FIG. 5 shows a drive circuit for a single motor winding of a brushless DC motor. Also disclosed is a system for controlling a brushless DC motor wherein each motor winding is controlled by a different electronic switch and a corresponding drive circuit.

In an embodiment, the feedback signal, y(n), consists of a single, time-varying, scalar quantity. In this embodiment, the feedback signal, y(n) represents the measured signal (e.g. the drain current, $i_D$) with only one quantity for example, using only magnitude measurements. Where the feedback signal consists of a single time-varying quantity subsequent components in the electronic switching circuit of FIG. 5 are simpler to implement. For example, in this scenario the comparator 506 only has to compare two quantities (i.e. a single value of the feedback signal and a single value of the delayed input signal).

Figure 6:
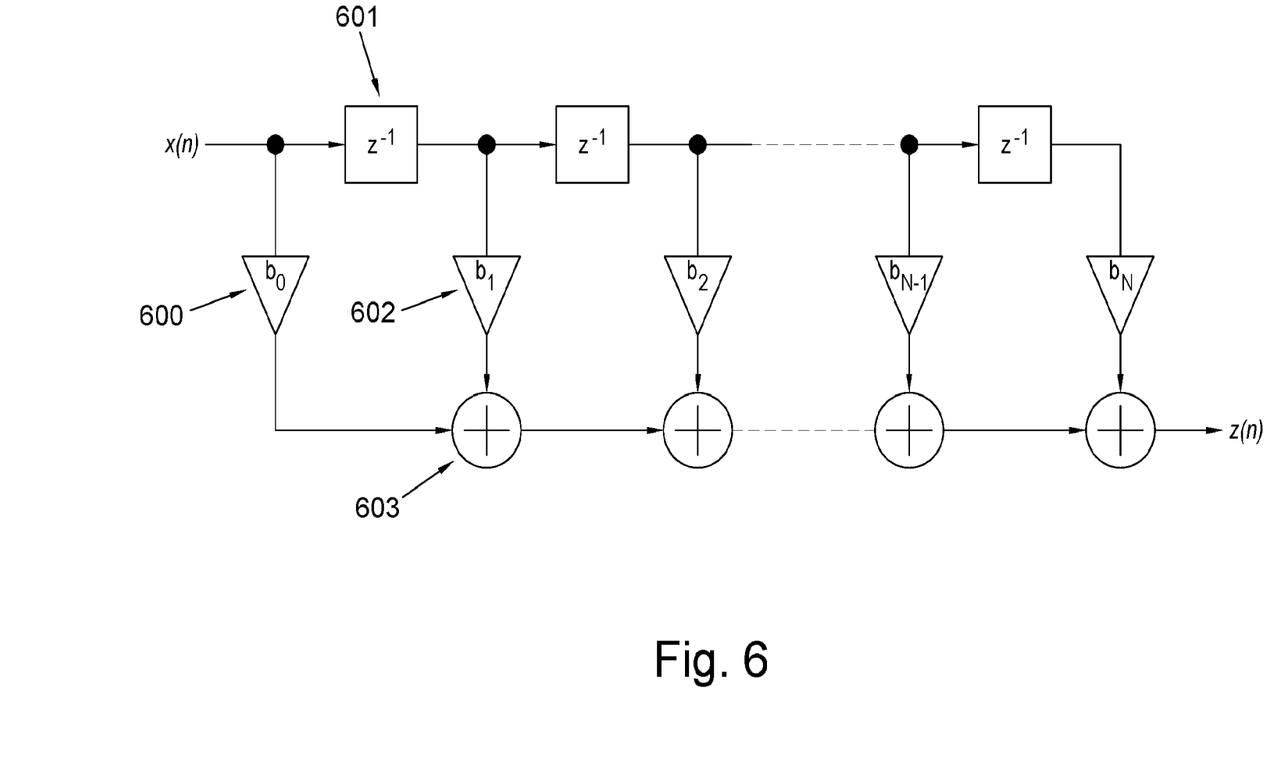
FIG. 6 shows a Finite Impulse Response (FIR) filter according to an embodiment.

FIG. 6 shows a Finite Impulse Response (FIR) filter according to an embodiment. The Finite Impulse Response (FIR) filter shown in FIG. 6 comprises a first clocked delay element 601, a first amplifier 600 with a scalar magnitude, $b_0$, a second amplifier 602 with a scalar amplitude, $b_1$, and a summation component 603. The FIR filter generates an output waveform by using a tapped delay line consisting of a chain of delay elements whose outputs are modified by a gain weighting and subsequently summed.

In the FIR filter of FIG. 6 a sample of the input signal, e.g. x(1), is amplified by magnitude, $b_0$. This value is then summed, by the summation component 603, with the output of the second amplifier 602 to form the pre-distorted signal, z(n). The output of the second amplifier represents the input signal from one clock cycle ago, e.g. x(0), multiplied by the scalar magnitude $b_1$. Each amplifier in FIG. 6 represents a tap of the FIR filter.

In an embodiment the FIR filter comprises as many taps as are necessary to reduce the ringing on the drain current waveform, $i_D$. In an embodiment the scalar magnitudes $b_N$ are coefficients of the FIR filter and are generated and modified by the adaption algorithm block 505 in FIG. 5. In use the scalar magnitudes, $b_N$, are modified by the adaption algorithm block 505 in a way that ensures that the error signal, e(n), is minimised.

Unlike previous approaches the closed loop control system shown in FIG. 5 allows the FIR filter to be iteratively adapted at a slow rate to reduce the ringing on the drain current, $i_D$.

Advantageously, the closed loop system shown in FIG. 5 can reduce manufacturing time and cost since it can be optimised in use. Optionally, the system shown in FIG. 5 is pre-loaded during manufacture with a plurality of coarse filter coefficients (i.e. a plurality of scalar amplitudes) that are updated in use. Furthermore, the system shown in FIG. 5 also permits software updates to change the amount of ringing tolerated by the control system. This is particularly advantageous in view of changing regulations or changing user requirements.

Each of the attenuator 503, the delay element 504, the adaption algorithm 505 and the digital pre-distorter 501 of FIG. 5 can be implemented as separate components using hardware, firmware or software.

Alternatively, some or all of these components can be implemented together on a single platform. For example, in an embodiment the delay element 504, the adaption algorithm 505 and the pre-distorter 501 are implemented on a field-programmable-gate-array (FPGA), or an Application Specific Integrated Circuit (ASIC).

Alternatively, in another embodiment some components, e.g. the adaption algorithm 405, are implemented in software whereas other components are implemented in other ways, e.g. in hardware. In one example the non-time critical elements (e.g. the adaption algorithm 505) are implemented on a microcontroller such as an Arduino® or a Raspberry Pi® while the time-critical elements (e.g. the digital predistorter 501) are implemented in a manner that cannot be interrupted by other processes (e.g. by hardware or firmware).

In FIG. 5 the digital pre-distorter 501 is implemented using a Finite Impulse Response (FIR) filter. However it is emphasized that other implementations are also possible.

Figure 7:
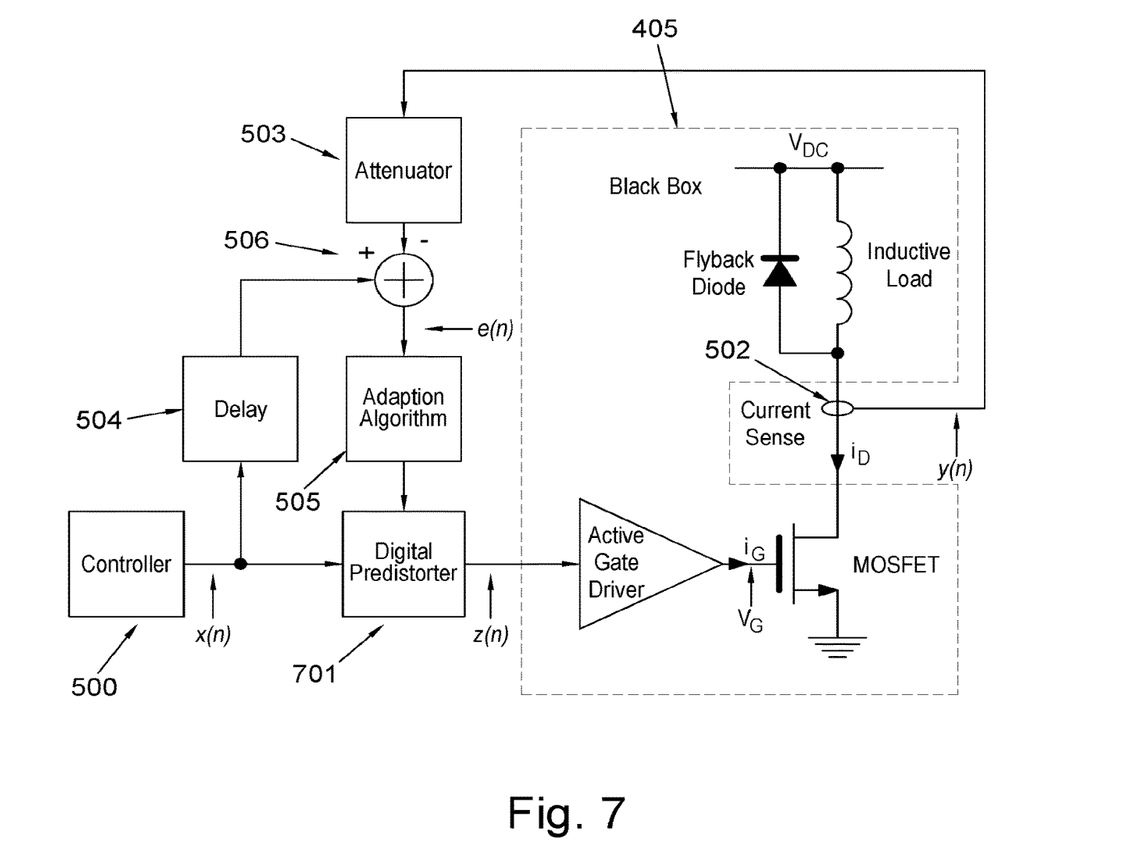
FIG. 7 shows an electronic switching circuit according to an embodiment.

FIG. 7 shows an electronic switching circuit according to an embodiment. In FIG. 7 similar reference numerals to FIG. 5 are used to represent similar components, as a result a detailed discussion of each component's functionality will be omitted for the sake of brevity.

In FIG. 7 a digital pre-distorter 701 is implemented as any one of: memory polynomial, memory based Volterra, dynamic deviation reduction, deep neural network, nested look-up-table stored in memory, envelope memory polynomial, Wiener, Hammerstein and twin nonlinear two-box.

When the digital pre-distorter 701 is implemented using a look-up table, the look-up table comprises an output signal value for each combination of input signal value and adaption algorithm output value.

The output format of the adaption algorithm 505 may also vary depending on the manner in which the digital pre-distorter 701 is implemented. For example, when the digital pre-distorter 701 is implemented as a Volterra series the output of the adaption algorithm 505 will comprises coefficients for each term in the digital pre-distorter implementation (e.g. the linear term, the quadratic term, the cubic term, etc. up to the $n^{th}$ term). Likewise, when the digital pre-distorter 701 is implemented as a memory polynomial the output of the adaption algorithm 505 comprises coefficients for each term (i.e. the linear term, the quadratic term, etc. up to the $n^{th}$ term) for each filter tap.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A controller, comprising:
an electronic switch configured to control a current flow in a motor winding based on a pre-distorted signal;
a digital pre-distorter configured to generate, using a waveform shaper, the pre-distorted signal based on an input signal and a plurality of waveform shaping coefficients;
a delay element configured to delay the input signal;
a comparator configured to generate an error signal based on a difference between the delayed input signal and a feedback signal, the feedback signal representing the current flow in the motor winding; and
a circuit configured to receive the error signal and generate the plurality of waveform shaping coefficients based on the difference between the delayed input signal and the feedback signal.

2. The controller according to claim 1, further comprising an attenuator configured to fix an amplitude of the feedback signal.

3. The controller according to claim 1, wherein the delay element is configured to delay the input signal such that samples of the input signal align with samples of the feedback signal.

4. The controller according to claim 1, wherein the motor winding is in a Brushless DC motor.

5. The controller according to claim 1, wherein the electronic switch is a Metal Oxide Semiconductor Field Effect Transistor or an Insulated-gate Bipolar transistor.

6. The controller according to claim 1, further comprising an active gate driver connected to an input of the electric switch,
wherein the active gate driver is configured to amplify the pre-distorted signal.

7. The controller according to claim 1, further comprising a current sensor configured to measure the current flow in the motor winding and generate the feedback signal.

8. The controller according to claim 7, wherein
the feedback signal comprises a current signal and a voltage signal;
the current signal is measured by the current sensor; and
the controller further comprises a voltage sensor configured to measure a voltage at the motor winding and generate the voltage signal.

9. An electric apparatus, comprising:
a plurality of electric motor windings; and
a plurality of controllers according to claim 1,
wherein each motor winding in the plurality of electric motor windings is controlled by an a controller of the plurality of controllers.

10. The controller according to claim 1, wherein the circuit is configured to generate the plurality of waveform shaping coefficients in a way that the difference between the delayed input signal and the feedback signal is minimized.

11. A method, comprising:
controlling a current flow in a motor winding based on a pre-distorted signal;
generating, using a waveform shaper, the pre-distorted signal based on an input signal and a plurality of waveform shaping coefficients;
delaying the input signal;
generating an error signal based on a difference between the delayed input signal and a feedback signal, the feedback signal representing the current flow in the motor winding;
receiving the error signal; and
generating the plurality of waveform shaping coefficients based on the difference between the delayed input signal and the feedback signal.

12. The method according to claim 11, further comprising fixing an amplitude of the feedback signal.

13. The method according to claim 11, wherein delaying comprises delaying the input signal such that samples of the input signal align with samples of the feedback signal.

14. The method according to claim 11, wherein the motor winding is in a Brushless DC motor.

15. The method according to claim 11, wherein the current flow is controlled using a Metal Oxide Semiconductor Field Effect Transistor or an Insulated-gate Bipolar transistor.

16. The method according to claim 11, further comprising amplifying the pre-distorted signal.

17. The method according to claim 11, further comprising:
measuring the current flow in the motor winding; and
generating the feedback signal.

18. The method according to claim 11, wherein generating comprises generating the plurality of waveform shaping coefficients in a way that the difference between the delayed input signal and the feedback signal is minimized.

* * * * *